United States Patent [19]
Blodgett

[11] Patent Number: 5,396,196
[45] Date of Patent: Mar. 7, 1995

[54] QUADRATURE MODULAR WITH ADAPTIVE SUPPRESSION OF CARRIER LEAKAGE

[75] Inventor: James R. Blodgett, Derry, N.H.
[73] Assignee: AT&T Corp., Murray Hill, N.J.
[21] Appl. No.: 174,923
[22] Filed: Dec. 29, 1993
[51] Int. Cl.[6] .......................................... H04L 27/36
[52] U.S. Cl. .................................. 332/103; 332/123;
  332/162; 455/63; 455/126; 375/261; 375/284;
  375/285
[58] Field of Search ............... 332/103, 104, 105, 123,
  332/162, 167, 168, 170; 375/39, 43, 61, 57, 58;
  455/46, 47, 63, 109, 126

[56] References Cited
U.S. PATENT DOCUMENTS

| | | | |
|---|---|---|---|
| 4,243,955 | 1/1981 | Daniel et al. | 332/167 |
| 4,843,351 | 6/1989 | Edwards et al. | 332/103 |
| 5,012,208 | 4/1991 | Mäkinen et al. | 332/103 |

*Primary Examiner*—Siegfried H. Grimm

[57] ABSTRACT

A carrier leakage suppression circuit is disclosed which adaptively suppresses carrier leakage in a signal processing device which modulates a carrier signal with an in-phase baseband signal and a quadrature baseband signal to generate a radio frequency (RF) output signal. The carrier leakage suppression circuit operates by imparting a first signature to the in-phase baseband signal and a second signature to the quadrature baseband signal prior to modulation of the carrier signal. In-phase and quadrature carrier leakage components in the RF output signal are isolated and measured by respectively correlating the RF output signal with the first and second signatures. An in-phase offset and a quadrature offset are generated as a function of the measurement of the in-phase and quadrature carrier leakage components. The in-phase baseband signal is combined with the in-phase offset and the quadrature baseband signal is combined with the quadrature offset to thereby suppress carrier leakage.

13 Claims, 3 Drawing Sheets

QUADRATURE MODULAR WITH ADAPTIVE SUPPRESSION OF CARRIER LEAKAGE

BACKGROUND OF THE INVENTION

1. Field of the Invention

The present invention relates generally to quadrature modulators, and more particularly to suppressing carrier leakage in quadrature modulators.

2. Related Art

FIG. 1 is a block diagram of a conventional quadrature modulator 102 comprising two bi-phase modulators 104, 106, a phase shifter 108, and a combiner 110. The quadrature modulator 102 operates generally as follows.

The modulator 104 modulates a first carrier signal 116 using an in-phase (I) baseband signal 112 to thereby produce a modulated in-phase signal 120. The phase shifter 108 receives the first carrier signal 116 and generates therefrom a second carrier signal 124, wherein the second carrier signal 124 is in quadrature with the first carrier signal 116 (that is, the second carrier signal 124 is 90 degrees out of phase with the first carrier signal 116).

The modulator 106 modulates the second carrier signal 124 with a quadrature (Q) signal 114 to thereby produce a modulated quadrature signal 122, wherein the modulated quadrature signal 122 is in quadrature with the modulated in-phase signal 120. The modulated in-phase signal 120 and the modulated quadrature signal 122 are then combined in-phase by the combiner 110 to thereby produce a radio frequency (RF) output signal 118.

The in-phase signal 112 and the quadrature signal 114 typically range in frequency from approximately 0 Hz to 2 MHz. The frequency of the first carrier signal 116 is typically approximately 900 MHz. These frequencies are provided for illustrative purposes only, and may be other values. As will be appreciated, the transmit frequency of the RF output signal 118 is substantially equal to the frequency of the first carrier signal 116.

Imperfections in the modulators 104, 106 result in the generation of undesired mixing products, such as signals having frequencies equal to some or all of the frequencies of the signals 112, 114, 116, 124 which were originally mixed by the modulators 104, 106. These undesired mixing products are combined with the modulated in-phase signal 120 and the modulated quadrature signal 122 by the combiner 110 to produce the RF output signal 118. In other words, the RF output signal 118 includes undesired signal components having frequencies equal to the frequency of the in-phase signal 112, the frequency of the quadrature signal 114, the frequencies of the first and/or second carrier signals 116, 124, and/or combinations of these frequencies.

Such undesired signal components having frequencies equal to the frequencies of the in-phase signal 112 and the quadrature signal 114 are easily filtered and eliminated from the RF output signal 118 since their frequencies (approximately 0 Hz to 2 MHz) are so different from the transmit frequency (approximately 900 MHz) of the RF output signal 118.

In contrast, the signal components having frequencies equal to the frequencies of the first and second carrier signals 116, 124 are difficult to eliminate from the RF output signal 118 since their frequencies are so close to the transmit frequency of the RF output signal 118. Since they originate from the first and second carrier signals 116, 124, these undesired signal components are called carrier leakage signals, or simply carrier leakage.

With regard to quadrature modulators, a DC offset applied to the quadrature baseband channel or rail (that is, added to the quadrature baseband signal) operates to cancel the quadrature component of the carrier leakage. Similarly, a DC offset applied to the in-phase baseband channel operates to cancel the in-phase component of the carrier leakage. Thus, it is possible to substantially eliminate carrier leakage by applying appropriate DC offsets to the quadrature and/or in-phase baseband channels.

Also, carrier leakage can be substantially eliminated by appropriately selecting component values to thereby balance the bi-phase modulators contained in quadrature modulators.

However, the application of DC offsets to the quadrature and/or in-phase baseband channels and the selection of component values to balance the bi-phase modulators do not represent complete solutions since carrier leakage varies with many factors, such as temperature, frequency, load impedance, and carrier power. Consequently, the component values selected to balance the bi-phase modulators and to thereby eliminate carrier leakage when the operating temperature is M degrees will probably not be adequate to eliminate carrier leakage when the operating temperature changes to N degrees.

Similarly, the DC offsets calculated to eliminate carrier leakage when the carrier frequency is X MHz will probably not be adequate to eliminate carrier leakage when the carrier frequency changes to Y MHz. This is particularly true for direct modulation (where a baseband signal modulates a carrier signal whose carrier frequency is equal to the transmit frequency) where the carrier frequency may often change.

Thus, what is required is a quadrature modulator wherein carrier leakage is suppressed even when the carrier leakage changes due to factors such as temperature, frequency, load impedance, and carrier power.

SUMMARY OF THE INVENTION

The present invention is directed to a carrier leakage suppression circuit for adaptively suppressing carrier leakage in a signal processing device, such as a quadrature modulator or a single sideband upconverter or downconverter, which modulates a carrier signal with an in-phase baseband signal and a quadrature baseband signal to generate a radio frequency (RF) output signal.

The carrier leakage suppression circuit operates by imparting a first signature to the in-phase baseband signal and a second signature to the quadrature baseband signal prior to modulation of the carrier signal such that, after modulation, the RF output signal includes an in-phase carrier leakage component that carries the first signature and a quadrature carrier leakage component that carries the second signature.

The carrier leakage suppression circuit isolates and measures in the RF output signal the in-phase and quadrature carrier leakage components by respectively correlating the RF output signal with the first and second signatures. Then, an in-phase offset and a quadrature offset are generated as a function of the measurement of the in-phase and quadrature carrier leakage components.

The in-phase baseband signal is combined with the in-phase offset and the quadrature baseband signal is combined with the quadrature offset to thereby suppress carrier leakage.

Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE FIGURES

The present invention will be described with reference to the accompanying drawings, wherein.

DETAILED DESCRIPTION OF THE PREFERRED EMBODIMENTS

The present invention is directed to a carrier leakage suppression circuit to adaptively suppress (or null) carrier leakage in a quadrature modulator. Alternatively, the present invention is directed to a quadrature modulator having this carrier leakage suppression circuit.

Since it is adaptive, the carrier leakage suppression circuit of the present invention suppresses carrier leakage even when temperature, load impedance, carrier power, operating frequency, etc., changes. In other words, the carrier leakage suppression circuit is insensitive to factors which normally affect carrier leakage, such as temperature, load impedance, carrier power, and operating frequency. The carrier leakage suppression circuit also cancels undesired DC (direct current) offsets in baseband signals due to amplifier drift or other factors.

Since the carrier leakage suppression circuit adaptively cancels carrier leakage, DC coupling of baseband signals is possible when otherwise AC coupling would be used. Also, a quadrature modulator having the carrier leakage suppression circuit of the present invention is well suited for direct modulation applications. Consequently, direct modulation may be used in applications where it otherwise might not be considered.

The carrier leakage suppression circuit of the present invention is described herein with reference to a quadrature modulator. However, the carrier leakage suppression circuit can be used with other communication devices to adaptively suppress carrier leakage generated therein. Such communication devices include, but are not limited to, single sideband upconverters and downconverters, double sideband upconverters and downconverters, and bi-phase modulators. The use of the carrier leakage suppression circuit with these devices is discussed further below.

As discussed above, in a preferred embodiment of the present invention the carrier leakage suppression circuit applies various spread-spectrum communication techniques to perform its function. Such spread-spectrum communication techniques are well known and are discussed in many publicly available documents, such as Don J. Torrieri, *Principles of Military Communication Systems*, Artech House, Inc., Dedham, Mass., third printing, 1982, which is herein incorporated by reference in its entirety.

Figure 1:
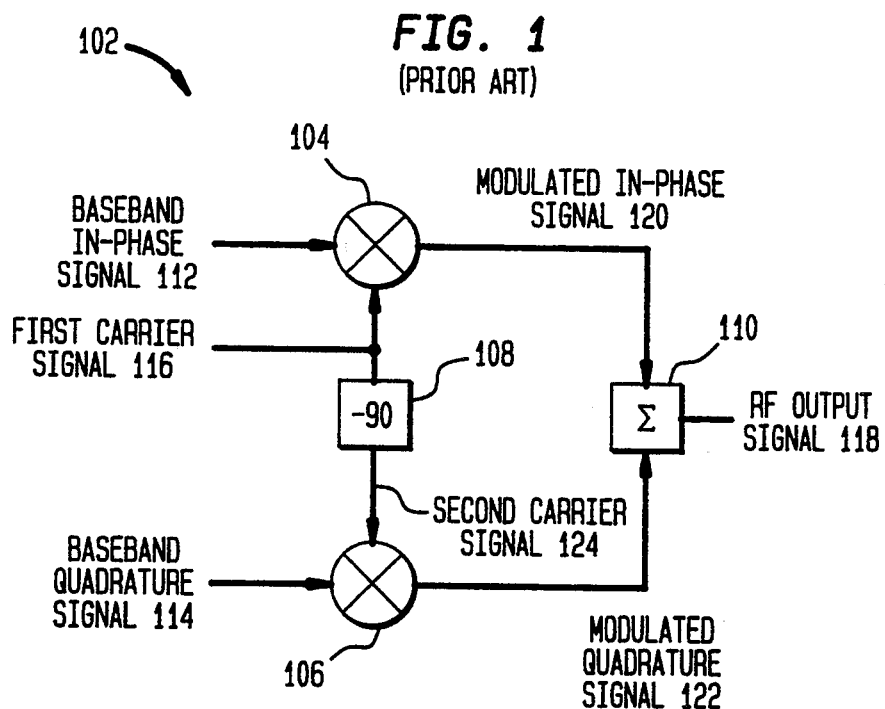
FIG. 1 is a block diagram of a conventional quadrature modulator.
Figure 2:
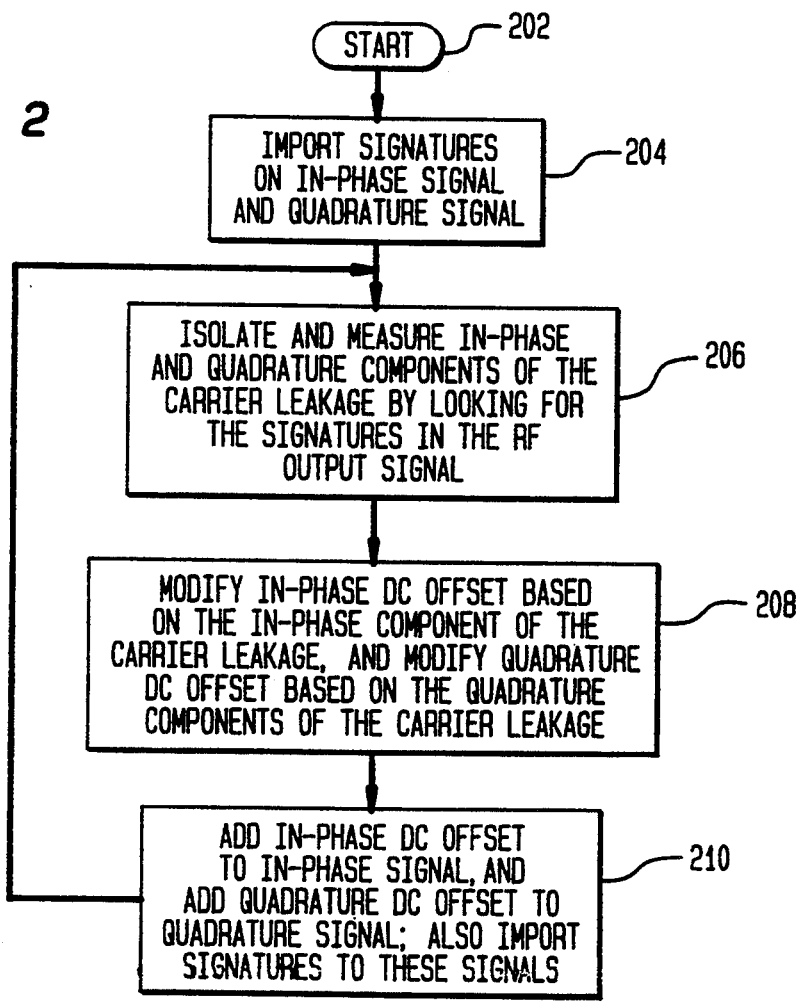
FIG. 2 is a flowchart depicting the high-level operation of a carrier leakage suppression circuit according to a preferred embodiment of the present invention.

The manner in which the carrier leakage suppression circuit of the present invention operates to suppress carrier leakage in a quadrature modulator shall now be generally discussed with reference to FIG. 2 which illustrates a flowchart depicting the high-level operation of the carrier leakage suppression circuit. For illustrative purposes, the high-level operation of the carrier leakage suppression circuit is described with reference to the quadrature modulator 102 shown in FIG. 1, although it should be noted that the carrier leakage suppression circuit is not shown in FIG. 1.

In a step 204, the carrier leakage suppression circuit imparts a first signature to the in-phase baseband signal 112 and a second signature to the quadrature baseband signal 114. The first and second signatures are imparted to the in-phase signal 112 and the quadrature signal 114 using spread-spectrum techniques, and are used to identify the in-phase and quadrature components of the carrier leakage, as will be described next.

In a step 206, after the RF output signal 118 has been generated, the carrier leakage suppression circuit isolates and measures the in-phase component of the carrier leakage (that is, the carrier leakage component signal having a frequency equal to the frequency of the in-phase signal 112) and the quadrature component of the carrier leakage (that is, the carrier leakage component signal having a frequency equal to the frequency of the quadrature signal 114) by looking for the first and second signatures in the RF output signal. The center frequencies of the in-phase signal 112 and the quadrature signal 114 are substantially the same.

In a step 208, the carrier leakage suppression circuit generates an in-phase DC offset based on the measurement of the in-phase component of the carrier leakage made in step 206. Also, the carrier leakage suppression circuit generates a quadrature DC offset based on the measurement of the quadrature component of the carrier leakage made in step 206. In practice, during step 208 the carrier leakage suppression circuit uses the measurements of the in-phase carrier leakage component and the quadrature carrier leakage component to modify existing in-phase and quadrature DC offsets, respectively.

In a step 210, the carrier leakage suppression circuit adds the in-phase DC offset to the in-phase baseband signal 112 to thereby cancel at least a portion of the in-phase carrier leakage component. Similarly, the carrier leakage suppression circuit adds the quadrature DC offset to the quadrature baseband signal 114 to thereby cancel at least a portion of the quadrature carrier leakage component.

Also in step 210, new signatures are imparted to the in-phase baseband signal 112 and the quadrature basement signal 114 (after performing the addition involving the in-phase and quadrature DC offsets), and the series of steps beginning with step 206 are repeated. In practice, substantially complete cancellation of carrier leakage is achieved after the performance of a number of iterations of the steps shown in FIG. 2.

Note that the carrier leakage suppression circuit adjusts the in-phase DC offset and the quadrature DC offset as the in-phase carrier leakage component and the quadrature carrier leakage component change, irrespective of the cause(s) of such changes. Thus, the carrier leakage suppression circuit suppresses carrier leakage even when temperature, load impedance, carrier power, operating frequency, etc., changes. In other words, the carrier leakage suppression circuit is insensitive to factors which normally affect carrier leakage, such as temperature, load impedance, carrier power, and operating frequency.

The carrier leakage suppression circuit shall now be discussed in greater detail.

Figure 3:
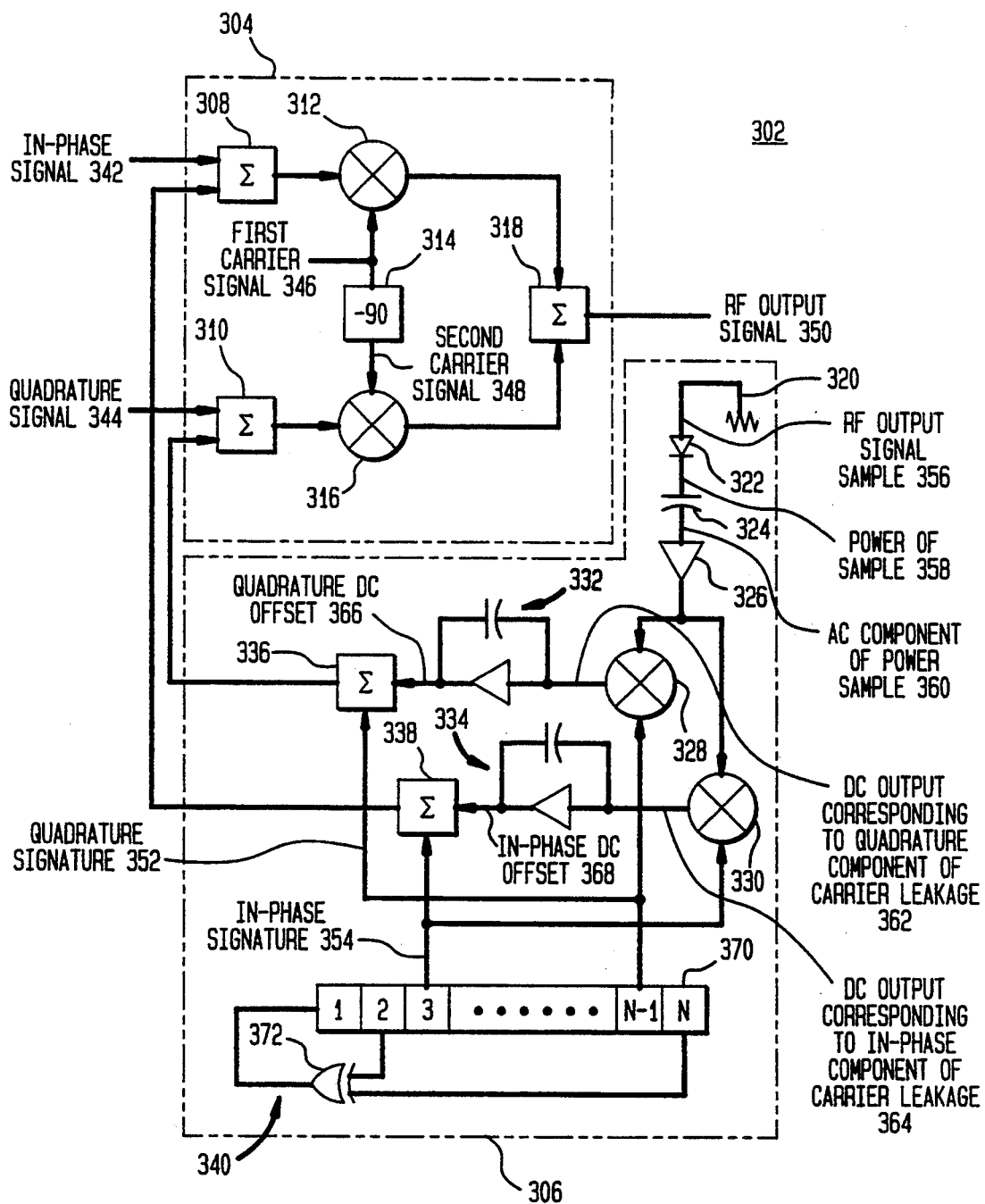
FIG. 3 is a block diagram of a signal processing device comprising a carrier leakage suppression circuit according to a preferred embodiment of the present invention.

FIG. 3 illustrates a block diagram of a signal processing device 302 which includes a quadrature modulator 304 and a carrier leakage suppression circuit 306 according to a preferred embodiment of the present invention. The quadrature modulator 304 includes two bi-phase modulators 312, 316, a phase shifter 314, and a combiner 318. These components of the quadrature modulator 304 are similar to the bi-phase modulators 104, 106, the phase shifter 108, and the combiner 110, respectively, of the quadrature modulator 102 shown in FIG. 1. Accordingly, the structure and operation of the bi-phase modulators 312, 316, the phase shifter 314, and the combiner 318 shall not be discussed further, other than to state that these components are well known, and may be implemented using any of a number of readily available circuit components such as diodes, Gilbert cells, analog multipliers, etc., and may be implemented discretely or monolithically.

Figure 4:
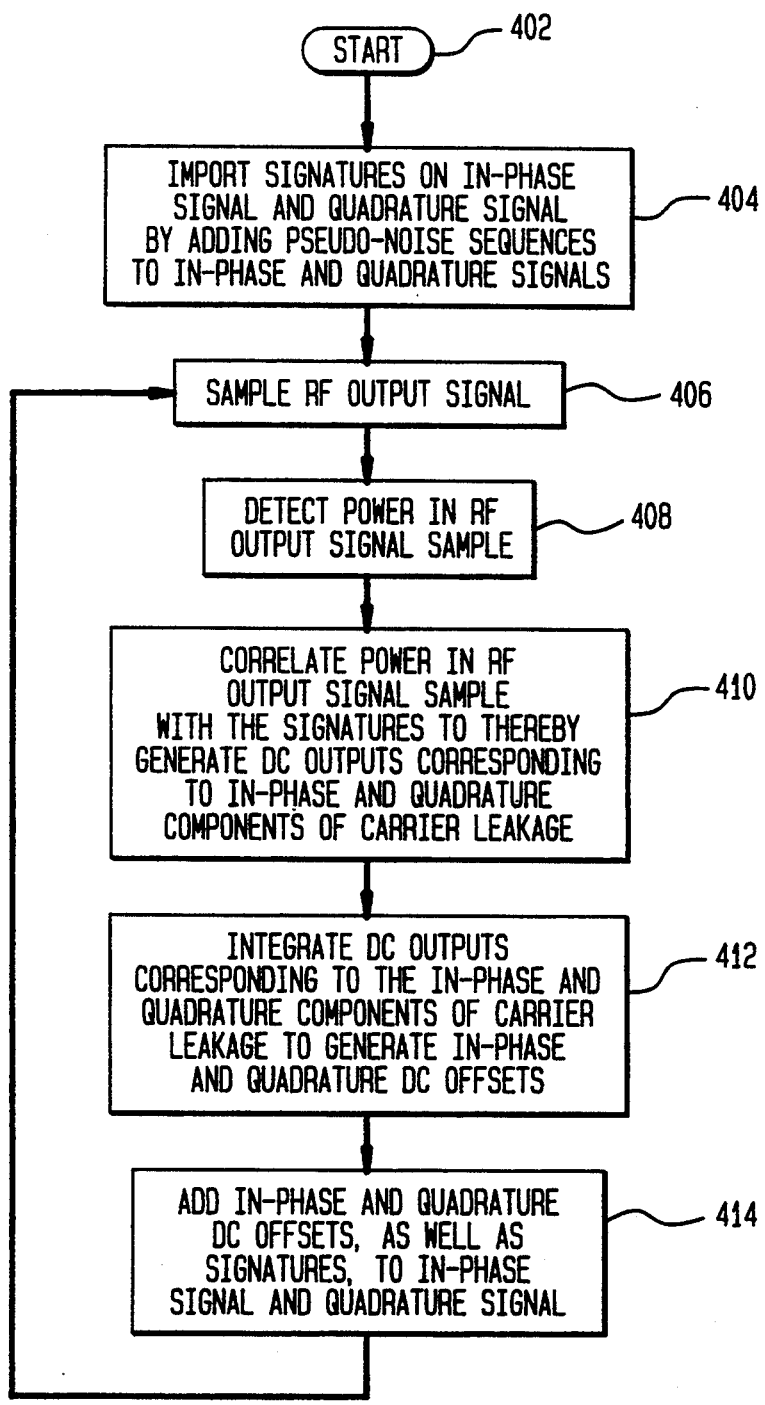
FIG. 4 is a flowchart depicting the preferred operation of the carrier leakage suppression circuit of FIG. 3.

The discussion of the present invention shall now be continued by referring to FIG. 4 in addition to FIG. 3, wherein FIG. 4 illustrates a flowchart depicting the operation of the carrier leakage suppression circuit 306 according to the preferred embodiment of the present invention.

The carrier leakage suppression circuit 306 includes a pseudo-noise (PN) generator 340 having a code length N which is of sufficient size to ensure a negligible DC offset. The PN generator 340, the structure and operation of which will be apparent to persons skilled in the relevant art, includes a shift register 370 and an exclusive-OR gate 372.

An in-phase signature signal 354 is generated by sampling the shift register 370 at bit position 3, and a quadrature signature signal 352 is generated by sampling the shift register 370 at bit position N-1. The selection of the bit positions from which to sample the shift register 370 is arbitrary, and can be any that would produce non-correlated samples of pseudo-noise sequence (that is, if the two samples were multiplied together, noise would result, rather than a signal having a DC component).

The in-phase and quadrature signatures 354, 352 represent spread-spectrum signatures. As used herein, the term "spread-spectrum signature" refers to a low-level direct-sequence spread spectrum signal which is added to a baseband signal (such as the in-phase and quadrature baseband signals 342, 344). Direct-sequence spread spectrum signals are well known to persons skilled in the relevant art.

As will be discussed hereafter, the in-phase and quadrature signature signals 354, 352 are added to the in-phase and quadrature baseband signals 342, 344, respectively, for the purpose of isolating the in-phase and quadrature components of the carrier leakage. To avoid interference with the modulation functions performed by the quadrature modulator 304, the in-phase signature signal 354 and quadrature signature signal 352 are generated by the PN generator 340 at a low power level relative to the baseband signals 342, 344.

Preferably, the in-phase signature signal 354 and quadrature signature signal 352 are each approximately 40 dB below the power level of the baseband signals 342, 344. Note, however, that the in-phase and quadrature signature signals 354, 352 must be maintained at a sufficiently high power level to be detected by correlators 328, 330 (discussed below).

The in-phase signature signal 354 is added to an in-phase DC offset 368 (discussed in greater detail below) in a combiner 338, and then this combined signal is added to the in-phase baseband signal 342 in a combiner 308 located in the quadrature modulator 304. Initially, the in-phase DC offset 368 is cleared to zero, so that during the initial iteration through the flowchart of FIG. 4 the in-phase signature signal 354 alone is added to the in-phase baseband signal 342 in the combiner 308.

Similarly, the quadrature signature signal 352 is added to a quadrature DC offset 366 (discussed in greater detail below) in a combiner 336, and then this combined signal is added to the quadrature baseband signal 344 in a combiner 310 located in the quadrature modulator 304. Initially, the quadrature DC offset 366 is cleared to zero, so that during the initial iteration through the flowchart of FIG. 4 the quadrature signature signal 352 alone is added to the quadrature baseband signal 344 in the combiner 310.

The operation of the carrier leakage suppression circuit 306 as thus far described corresponds to a step 404 of FIG. 4, wherein the in-phase and quadrature signatures 354, 352 have been generated and imparted on the in-phase and quadrature baseband signals 342, 344. The in-phase and quadrature baseband signals 342, 344 are then processed by the other components of the quadrature modulator 304 to thereby generate a radio frequency (RF) output signal 350, as described above with respect to the quadrature modulator 102 in FIG. 1.

The carrier leakage suppression circuit 306 then processes the RF output signal 350 by performing steps 406-414 in FIG. 4, as shall now be described.

In a step 406, a directional coupler 320 samples the RF output signal 350. The output of the directional coupler 320 is a RF output signal sample 356. Directional couplers are well known, and thus further details of the directional coupler 320 will be apparent to persons skilled in the relevant art.

In a step 408, a diode detector 322 measures the amplitude of the RF output signal sample 356. Equivalently, in step 408 the diode detector 322 detects the power (or power spectrum) in the RF output signal sample 356 to thereby produce a sample power signal 358. Diode detectors are well known, and thus further details of the diode detector 322 will be apparent to persons skilled in the relevant art.

Most of the power detected by the diode detector 322 corresponds to the signal which is desired to be transmitted by the quadrature modulator 304. Part of the power detected by the diode detector 322 corresponds to carrier leakage. As discussed below, the carrier leakage suppression circuit 306 isolates and measures the carrier leakage power in the sample power signal 358, and then uses this power measurement to adjust the in-phase and quadrature DC offsets 368, 366 which are added to the in-phase and quadrature baseband signals 342, 344, respectively, to thereby suppress carrier leakage.

Also in step 408, a capacitor 324 removes the DC component from the sample power signal 358 to produce an AC (alternating current) sample power signal 360 which represents the time varying component of the sample power signal 358. An amplifier 326 then amplifies the AC sample power signal 360. Capacitors and amplifiers are well known, and thus further details of the capacitor 324 and the amplifier 326 will be apparent to persons skilled in the relevant art.

It should be noted that the capacitor 324 and the amplifier 326 represent implementation details and are therefore optional. They need not be present in the carrier leakage suppression circuit 306 to achieve the objectives and advantages of the present invention.

In a step 410, the carrier leakage suppression circuit 306 isolates the carrier leakage power in the amplified AC sample power signal 360. This is done by correlating the amplified AC sample power signal 360 with the in-phase and quadrature signatures 352,354 which were imparted to the in-phase and quadrature baseband signals 318, 320 in step 404.

Such correlation operates to select the carrier leakage components corresponding to the in-phase signal 342 and the quadrature signal 344, since such carrier leakage components carry the in-phase and quadrature signatures 352, 354. Power in the AC sample power signal 360 which does not correspond to the in-phase signal 342 or the quadrature signal 344 is de-correlated and, therefore, ignored (since it will appear to be noise).

Preferably, step 410 is performed by multiplying in a multiplier 330 the amplified AC sample power signal 360 with the in-phase signature signal 354 that was imparted on the in-phase baseband signal 342 in step 404. Similarly, the amplified AC sample power signal 360 is multiplied in a multiplier 328 with the quadrature signature signal 352 that was imparted on the quadrature baseband signal 344 in step 404. These multiplication operations result in de-spreading amplified AC sample power signal 360 in accordance with well known spread-spectrum theory. Multipliers for performing spread spectrum despreading operations are well known, and thus further details of the multipliers 328, 330 will be apparent to persons skilled in the relevant art.

As a result of the operation of step 410, the multiplier 328 generates a DC output signal 362 that corresponds to the quadrature component of the carrier leakage. The multiplier 330 generates a DC output signal 364 that corresponds to the in-phase component of the carrier leakage. That is, the amplitudes of the DC output signals 362, 364 are proportional to the amplitudes of the quadrature and in-phase components of the carrier leakage, respectively.

In a step 412, an integrator 332 integrates in a well known manner over the DC output signal 362 that corresponds to the quadrature component of the carrier leakage to adjust a quadrature DC offset 366 (this quadrature DC offset 366 was initially generated during the first iteration through the flowchart of FIG. 4, and then adjusted during each iteration thereafter). Similarly, an integrator 334 integrates in a well known manner over the DC output signal 364 that corresponds to the in-phase component of the carrier leakage to adjust an in-phase DC offset 368 (this in-phase DC offset 368 was initially generated during the first iteration through the flowchart of FIG. 4, and then adjusted during each iteration thereafter).

In a step 414, the in-phase DC offset 368 is added to the in-phase baseband signal 342 to suppress at least part of the in-phase component of the carrier leakage. Similarly, the quadrature DC offset 366 is added to the quadrature baseband signal 344 to suppress at least part of the quadrature component of the carrier leakage. In practice, substantially complete cancellation of carrier leakage is achieved after the performance of a number of iterations of the steps shown in FIG. 4.

Also, in step 414 new in-phase and quadrature signatures 354, 352 are added to the in-phase and quadrature baseband signals 342, 344 to prepare for the next iteration (comprising steps 406, 408, 410; 412, and 414) through the flowchart of FIG. 4.

Preferably, step 414 is performed by adding the quadrature DC offset 366 to the new quadrature signature 352 in a combiner 336, and then adding the sum to the quadrature baseband signal 344 in a combiner 310. Similarly, the in-phase DC offset 368 is added to the new in-phase signature 354 in a combiner 338, and then the sum is added to the in-phase baseband signal 342 in a combiner 308. Combiners are well known, and thus further details of the combiners 308, 310, 336, and 338 will be apparent to persons skilled in the relevant art.

After the completion of step 414, the next iteration of steps 406, 408, 410, 412, and 414 begins.

The operation of the carrier leakage suppression circuit 306 is time continuous, rather than time discrete, such that the carrier leakage suppression circuit 306 continuously performs the steps of FIG. 4. It should be understood, therefore, that the above discussion (wherein the carrier leakage suppression circuit 306 is described as performing the steps of FIG. 4 in iterations) is provided for illustrative purposes only. In this regard, it should be noted that a chip period does not correspond to an iteration of the steps of FIG. 4. Instead, an iteration (as again used for illustrative purposes) represents many chip periods (for example, an iteration may represent hundreds, thousands, or more chip periods, depending on the particular implementation).

As clear from the discussion above, the carrier leakage suppression circuit 306 utilizes negative feedback to suppress carrier leakage (the circuit configuration of the carrier leakage suppression circuit 306 represents a negative feedback loop). By the nature of this negative feedback, the output of the multipliers 328, 330 are driven to zero such that the integrators 332, 334 assume output voltages which, when added to the quadrature and in-phase baseband signals 344, 342, further drive the outputs of the multipliers 328, 330 to zero.

Once the negative feedback loop of the carrier leakage suppression circuit 306 converges (that is, once the outputs of the multipliers 328, 330 are driven to substantially zero volts), the RF output signal 350 includes the desired signal, very low if any carrier leakage, and the well known (SIN X)/X spectrum of the pseudo-noise signatures 352, 354. As noted above, the signatures 352, 354 have a low power level, such that they do not degrade the desired signal.

Note that the quadrature and in-phase components of the carrier leakage are simultaneously and independently eliminated. This is the case, since the quadrature signature 352 and the in-phase signature 354 are generated by sampling different bit positions of the shift register 370, and since the quadrature DC offset 366 and in-phase DC offset 368 are independently generated. As a result, elimination of the quadrature and in-phase components of the carrier leakage is optimized, since the carrier leakage suppression circuit 306 adaptively adjusts to conditions that may be specific to the in-phase rail or the quadrature rail.

The carrier leakage suppression circuit 306 can be implemented using any well known circuit components, such as discrete operational amplifiers, logic gates, flip-flops, analog switches, and/or application specific integrated circuits (ASICs). More particularly, the PN generator can be implemented using CMOS (complementary metal oxide silicon) logic. Components which perform amplification, filtering, summation and integration functions can be implemented using operational amplifiers. Analog multipliers or operational amplifiers and FET (field effect transistor) switches can be used to perform the de-spreading function.

Preferably, the chipping rate of the PN generator 340 is between approximately 100 Hz and 20 kHz. Higher chipping rates allow faster convergence and faster tracking of variation but may complicate circuit design and may require more bandwidth than is available. Since Nyquist filtering is preferably not used (for simplicity purposes), the bandwidth of the pseudo-noise signal will be substantial relative to the chipping rate.

The carrier leakage suppression circuit 306 has been described with respect to a quadrature modulator. As noted above, however, the carrier leakage suppression circuit 306 can be used with other communication devices to adaptively suppress carrier leakage generated therein. Such communication devices include, but are not limited to, single sideband upconverters and downconverters, double sideband upconverters and downconverters, and bi-phase modulators.

Quadrature modulators are architecturally similar to single sideband upconverters/downconverters. Both quadrature modulators and single sideband upconverters/downconverters have in-phase and quadrature rails, and therefore the carrier leakage suppression circuit 306 is as well suited for use with single sideband upconverters/downconverters as with quadrature modulators.

The carrier leakage suppression circuit 306 can also be advantageously used with signal processing devices which do have in-phase and quadrature rails, such as double sideband upconverters/downconverters, and bi-phase modulators (with these devices, the carrier leakage suppression circuit 306 calculates a DC offset for only a single baseband signal, and combines the DC offset with this baseband signal). However, the suppression of carrier leakage with such devices may not be as great as with quadrature modulators and single sideband upconverters/downconverters. This is the case, since carrier leakage due to stray coupling or other effects may be in quadrature (or have quadrature components) and therefore will not be completely nulled by applying offsets.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A carrier leakage suppression circuit for adaptively suppressing carrier leakage in a signal processing device which modulates a carrier signal with a baseband signal to generate a radio frequency (RF) output signal, the carrier leakage suppression circuit comprising:

means for imparting a signature to the baseband signal prior to modulation of the carrier signal, such that after modulation the RF output signal includes a carrier leakage component that carries said signature;

means for isolating and measuring in the RF output signal said carrier leakage component by correlating the RF output signal with said signature;

means for generating as a function of said measurement of said carrier leakage component an offset signal; and means for combining the baseband signal with said offset signal to thereby suppress carrier leakage due to the baseband signal.

2. A carrier leakage suppression circuit for adaptively suppressing carrier leakage in a signal processing device which modulates a carrier signal with an in-phase baseband signal and a quadrature baseband signal to generate a radio frequency (RF) output signal, the carrier leakage suppression circuit comprising:

means for imparting a first signature to the in-phase baseband signal and a second signature to the quadrature baseband signal prior to modulation of the carrier signal, such that after modulation the RF output signal includes an in-phase carrier leakage component that carries the first signature and a quadrature carrier leakage component that carries the second signature;

means for isolating and measuring in the RF output signal said in-phase and quadrature carrier leakage components by respectively correlating the RF output signal with said first and second signatures;

means for generating as a function of said measurement of said in-phase and quadrature carrier leakage components an in-phase offset and a quadrature offset, respectively; and means for combining the in-phase baseband signal with said in-phase offset and the quadrature baseband signal with said quadrature offset to thereby suppress carrier leakage due to the in-phase baseband signal and the quadrature baseband signal.

3. The carrier leakage suppression circuit of claim 2, wherein said imparting means comprises:

a pseudo-noise (PN) generator for generating a first PN sequence representing said first signature and a second PN sequence representing said second signature, said first PN sequence being non-correlative relative to said second PN sequence;

a first combiner to combine said first PN sequence with the in-phase baseband signal; and a second combiner to combine said second PN sequence with the quadrature baseband signal.

4. The carrier leakage suppression circuit of claim 2, wherein said isolating and measuring means comprises:

a directional coupler to sample the RF output signal;

a diode detector to detect a power spectrum of the sampled RF output signal;

a first multiplier to multiply the detected power spectrum of the sampled RF output signal with said first signature to thereby generate an in-phase direct current (DC) signal corresponding to said in-phase carrier leakage component; and a second multiplier to multiply the detected power spectrum of the sampled RF output signal with said second signature to thereby generate a quadrature DC signal corresponding to said in-phase carrier leakage component.

5. The carrier leakage suppression circuit of claim 4, wherein said generating means comprises:

a first integrator for integrating over said in-phase direct current (DC) signal to adjust a value of said in-phase offset; and a second integrator for integrating over said quadrature direct current (DC) signal to adjust a value of said quadrature offset.

6. The carrier leakage suppression circuit of claim 2, wherein said combining means also combines said first and second signatures with the in-phase baseband signal and the quadrature baseband signal, respectively.

7. The carrier leakage suppression circuit of claim 2, wherein the signal processing device is a quadrature modulator.

8. The carrier leakage suppression circuit of claim 2, wherein the signal processing device is a single sideband upconverter.

9. A method for adaptively suppressing carrier leakage in a signal processing device which modulates a carrier signal with an in-phase baseband signal and a quadrature baseband signal to generate a radio frequency (RF) output signal, the method comprising the steps of:

(1) imparting a first signature to the in-phase baseband signal and a second signature to the quadrature baseband signal prior to modulation of the carrier signal, such that after modulation the RF output signal includes an in-phase carrier leakage component that carries the first signature and a quadrature carrier leakage component that carries the second signature;

(2) isolating and measuring in the RF output signal said in-phase and quadrature carrier leakage components by respectively correlating the RF output signal with said first and second signatures;

(3) generating as a function of said measurement of said in-phase and quadrature carrier leakage components an in-phase offset and a quadrature offset, respectively; and (4) combining the in-phase baseband signal with said in-phase offset and the quadrature baseband signal with said quadrature offset to thereby suppress carrier leakage due to the in-phase baseband signal and the quadrature baseband signal.

10. The method of claim 9, wherein step (1) comprises the steps of:

generating a first PN sequence representing said first signature and a second PN sequence representing said second signature, said first PN sequence being non-correlative relative to said second PN sequence;

combining said first PN sequence with the in-phase baseband signal; and combining said second PN sequence with the quadrature baseband signal.

11. The method of claim 9, wherein step (2) comprises the steps of:

sampling the RF output signal;

detecting a power spectrum of the sampled RF output signal;

multiplying the detected power spectrum of the sampled RF output signal with said first signature to thereby generate an in-phase direct current (DC) signal corresponding to said in-phase carrier leakage component; and multiplying the detected power spectrum of the sampled RF output signal with said second signature to thereby generate a quadrature DC signal corresponding to said in-phase carrier leakage component.

12. The method of claim 11, wherein step (3) comprises the steps of:

integrating over said in-phase direct current (DC) signal to adjust a value of said in-phase offset; and integrating over said quadrature direct current (DC) signal to adjust a value of said quadrature offset.

13. The method of claim 9, wherein step (4) also comprises the step of combining said first and second signatures with the in-phase baseband signal and the quadrature baseband signal, respectively.

* * * * *